United States Patent [19]

Sato

[11] Patent Number: 4,640,000
[45] Date of Patent: Feb. 3, 1987

[54] METHOD OF MANUFACTURING SEMICONDUCTOR DEVICE

[75] Inventor: Masaki Sato, Yokohama, Japan

[73] Assignee: Kabushiki Kaisha Toshiba, Japan

[21] Appl. No.: 686,375

[22] Filed: Dec. 26, 1984

[30] Foreign Application Priority Data

Dec. 27, 1983 [JP] Japan ................................ 58-244562

[51] Int. Cl.⁴ .......................................... H01L 21/443
[52] U.S. Cl. .................... 29/571; 29/576 W;
29/578; 29/591; 148/187
[58] Field of Search ............... 29/571, 576 W, 578, 29/591; 148/187

[56] References Cited

U.S. PATENT DOCUMENTS

| | | | |
|---|---|---|---|
| 4,330,931 | 5/1982 | Liu | 29/576 B |
| 4,356,040 | 10/1982 | Fu et al. | 29/571 X |
| 4,407,851 | 10/1983 | Kurosawa et al. | 29/571 X |
| 4,441,247 | 4/1984 | Gargini et al. | 29/576 B |
| 4,472,874 | 9/1984 | Kurosawa et al. | 29/571 X |
| 4,498,223 | 2/1985 | Goldman et al. | 29/571 |
| 4,510,670 | 4/1985 | Schwabe et al. | 148/174 X |
| 4,541,166 | 9/1985 | Yamazaki | 29/571 |

OTHER PUBLICATIONS

T. Moriya et al., "A Planar Metallization Process—Its Application to Tri-Level Alumina Interconnection", International Electron Devices Meeting, Dec. 7, 1983, Wash., D.C., pp. 550-553.

Muramoto, et al., "A New Self-Aligning Contact Process for MOS LSI," IEDM Technical Digest, International Electron Devices Meeting in Washington, D.C., Dec. 4-6, 1978.

Primary Examiner—George T. Ozaki
Attorney, Agent, or Firm—Finnegan, Henderson, Farabow, Garrett & Dunner

[57] ABSTRACT

A semiconductor device is fabricated by forming a gate structure including a gate insulating film and a gate electrode film formed thereon on a surface of an element formation region defined in a surface of a semiconductor substrate by an element isolation region. Then, an impurity having a conductivity type opposite to that of the substrate is doped by using the gate structure as a mask, thereby forming first and second semiconductor regions in the element formation region. An insulating wall is formed on a side wall of the gate structure, and an insulating film is deposited on an entire surface of the resultant semiconductor substrate structure. A portion of the insulating film which corresponds to a step portion formed by surfaces of the wall and the element formation region is selectively etched to form first and second contact holes. Finally, a wiring layer is formed on the remaining insulating film so as to electrically connect to the first and second semiconductor regions through the first and second contact holes.

15 Claims, 9 Drawing Figures

F I G. 1A
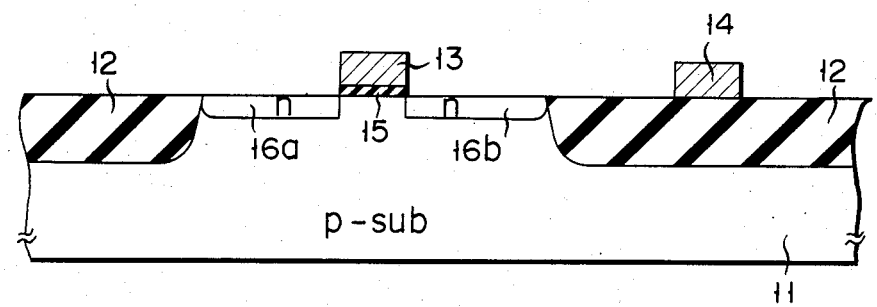
F I G. 1B
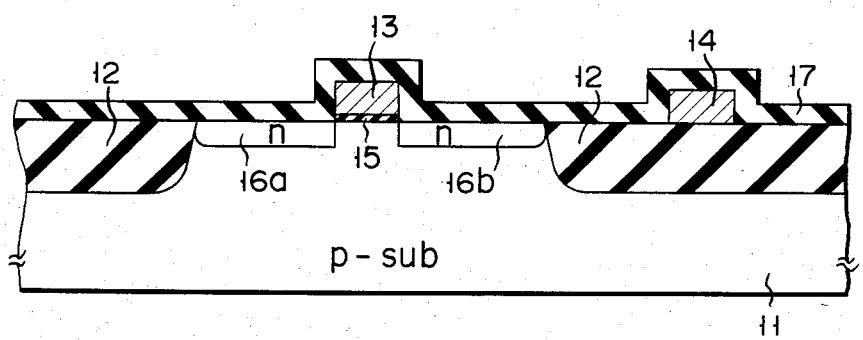
F I G. 1C
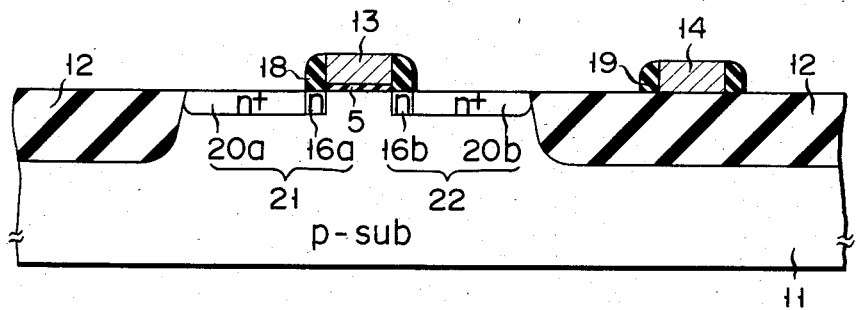

F I G. 2A
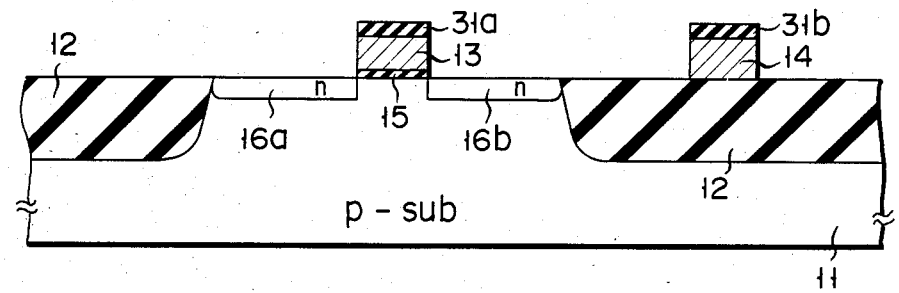
F I G. 2B
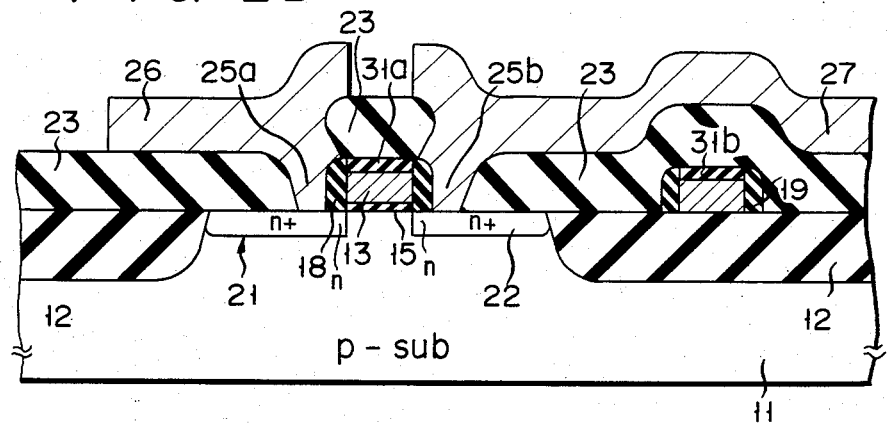
F I G. 3
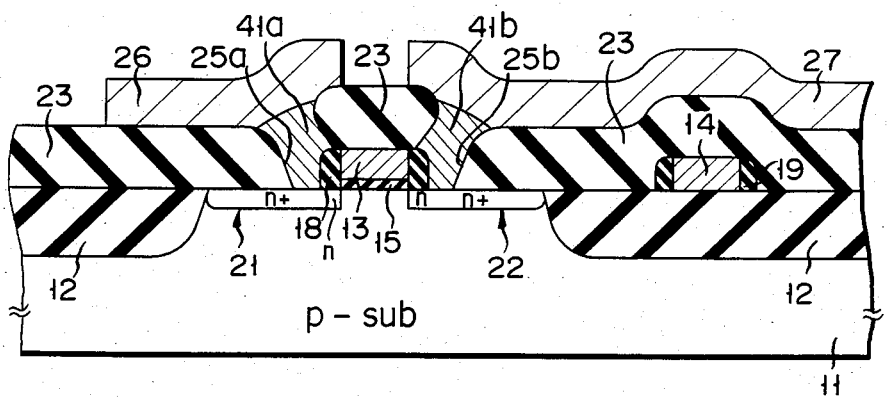

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing a MIS type semiconductor device, the method including an improved step of forming contact holes for source and drain regions.

2. Description of the Prior Art

Recent trends for higher integration and micropatterning of semiconductor integrated circuits, especially MOSICs, are remarkable. Along with this, gates having a size on the order of one micron or submicrons are being used in MOSICs. Micropatterning of semiconductor elements has depended upon size reduction by development of lithography techniques. However, when the element size is reduced to the order of one micron or submicrons, the elements cannot be highly integrated and operated at high speed by means of only a reduction in the sizes of gate electrodes, wiring layers, the impurity regions and contact holes. For example, a self-aligning contact technique is required to self align contact holes of impurity regions (i.e., source and drain regions) and wiring layers with gate electrodes and impurity regions.

A new contact hole formation method using a self-aligning technique was recently proposed by Muramoto et. al. in "A New Self-Aligning Contact Process for MOS LSI", IEDM, 1978, pp. 185-188. According to this method as illustrated in FIGS. 1(A) to 1(E) on p. 187 of this article, a gate oxide film is formed in an island element region surrounded by a silicon oxide field film, an arsenic-doped polycrystalline silicon layer is formed to cover the entire surface of the resultant structure, and a silicon nitride film is formed on the polycrystalline silicon layer. The silicon nitride film is selectively etched by plasma-reactive-sputter etching. The residual nitride film covers a portion of the polycrystalline silicon film which corresponds to prospective gate electrodes, contact holes, and a wiring layer. Thereafter, the polycrystalline silicon film is etched to a depth which is half the thickness thereof by using the residual silicon nitride film as a mask.

An impurity is ion-implanted through the residual thin polycrystalline silicon film by using the residual nitride silicon film as a mask, and arsenic is diffused from the residual polycrystalline silicon film into the substrate to form source and drain regions.

Thereafter, a silicon nitride film portion is left in the contact hole regions, and another portion of the silicon nitride film is etched, and the polycrystalline silicon film is selectively oxidized. By this selective oxidation of the polycrystalline silicon film, only a polycrystalline silicon film portion which excludes a portion corresponding to the contact hole regions and the gate electrode region is oxidized. The resultant oxidized polycrystalline silicon portion constitutes an intermediate insulating layer. The nonoxidized polycrystalline silicon portion constitutes a first wiring layer which directly contacts the source and drain regions.

According to this method by S. Muramoto et. al., the number of mask alignment operations can be decreased. In addition, a second wiring layer to be formed on the field oxide film can electrically contact the source and drain regions through the first wiring layer of polycrystalline silicon. As compared with the case wherein contact holes are formed by conventional photolithography techniques, mask alignment with the field oxide film requires only coarse alignment to form the contact holes.

However, in order to obtain a complete insulating effect of the oxidized polycrystalline silicon film according to the above method, polycrystalline silicon must be selectively oxidized at a high temperature (e.g., 850° C. or more) an undisclosed period of time. As a result, an oxidized polycrystalline silicon film portion is formed under the silicon nitride film acting as an oxidation mask, and the shape of the gate electrode changes. In addition to this disadvantage, the high temperature for selective oxidation of polycrystalline silicon causes the impurity regions already formed in the substrate to excessively extend in the substrate. Therefore, junction and gate capacitances increase and, as a result, prevent high-speed operation of the element.

SUMMARY OF THE INVENTION

It is, therefore, an object of the present invention to provide a method of manufacturing a semiconductor device, wherein a contact hole can be formed in a self-aligned manner without performing thermal oxidation at a high temperature.

According to the present invention, an element isolation region is formed in a surface layer of a semiconductor substrate of a first conductivity type to provide an island element region surrounded by the element isolation region. A gate structure including a gate insulating film and a gate electrode film formed thereon is formed on the surface of the island element region. An impurity of a second conductivity type opposite to the first conductivity type is doped in the island element region by using the gate structure as a mask, thereby obtaining first and second semiconductor regions. A wall of insulating material is formed on the side wall of the gate structure, and an insulating film is formed to cover the entire surface of the substrate which includes the element isolation region, the island element region, and the gate structure including the insulating wall.

Thereafter, only portions of the insulating film which corresponds to a step portion formed by the surfaces of the insulating wall and the element isolation region are selectively etched to form first and second contact holes so as to partially expose the first and second semiconductor regions. A wiring layer is then formed on the residual insulating film and is thus electrically connected to the first and second semiconductor regions through the first and second contact holes.

BRIEF DESCRIPTION OF THE DRAWINGS

FIGS. 1A to 1F are sectional views for explaining the steps in manufacturing an n-channel MOS transistor according to an embodiment of the present invention;

FIGS. 2A and 2B are sectional views for explaining a modification of the present invention; and FIG. 3 is a sectional view for explaining another modification of the present invention.

DETAILED DESCRIPTION OF THE PREFERRED EMBODIMENTS

Figure 1D:
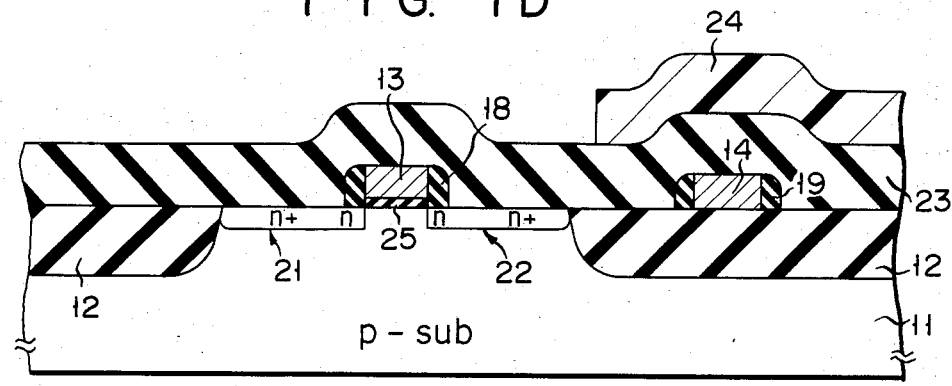

The present invention will be described in more detail with reference to the accompanying drawings. The same reference numerals denote the same parts in all the drawings.

FIGS. 1A to 1F are views showing an example when the present invention is applied to the production of an n-channel MOS transistor.

As shown in FIG. 1A, a buried silicon oxide film 12 (element isolation region) is formed in a p-type silicon substrate 11 having a resistivity of 10 to 20 Ωcm. The film 12 is formed by etching silicon substrate 11 to certain depth, and selectively oxidizing an etched portion. The silicon oxide film 12 has a thickness of, e.g., 0.6 μm. A thin silicon oxide film is formed on a surface of an island element formation region by a heat treatment. A thickness of the this silicon oxide film is, e.g., 300 Å (30 nm). In order to control a threshold voltage, boron not shown in the drawings is selectively ion-implanted in a prospective channel region of the element formation region. Boron not shown in the drawings is implanted, e.g., at an acceleration voltage of 70 KeV and a dose of $3.0 \times 10^{12}$ cm$^{-2}$.

A polycrystalline silicon film serving as a gate electrode and a wiring material is deposited on the overall surface of the resultant structure. The polycrystalline silicon, for example, has a sheet resistance of 20Ω/□ and a thickness of 4,000 Å (400 nm). Thereafter, the polycrystalline silicon film is patterned be reactive ion etching. By this patterning, a polycrystalline silicon portion 13 remains on the thin silicon oxide film and a polycrystalline silicon portion 14 remains on the silicon oxide film 12 to constitute a gate electrode and a first wiring layer, respectively. Thereafter, the thin silicon oxide film is selectively etched using the gate electrode 13 as a mask, thereby forming a gate oxide film 15 consisting of the remaining thin silicon oxide film.

Thereafter, an n-type impurity such as phosphorus is selectively ion-implanted in the surface of the element formation region using a gate structure constituted by the gate electrode 13 and the gate oxide film 15 as a mask and is activated so as to form n-type regions 16a and 16b. Phosphorus ions are implanted, e.g., at an acceleration voltage of 80 KeV and a dose of $5 \times 10^{13}$ cm$^{-2}$.

The resultant structure is cleaned and then subjected to thermal oxidation so as to form a thin oxide film (not shown) to a thickness of, e.g., 200 Å (20 nm) on the exposed surface of the element formation region as well as the surfaces of the gate electrode 13 and the first wiring layer 14 (for forming an insulating film (thermal oxide film) which permits smaller leak current than a CVD film). Thereafter, an insulating material film 17 is formed on the overall surface of the resultant structure (FIG. 1B). The film 17 can be formed of, for example, silicon oxide. In this case, the silicon oxide film 17 is deposited to a thickness of 4,000 Å (400 nm) on the overall surface of the resultant structure by a reduced-pressure CVD method. The silicon oxide film 17 is annealed in, e.g., a nitrogen atmosphere at a temperature of 900° C. for 40 minutes, thereby increasing a density of the film 17. Although this annealing need not always be performed, an etching rate of the annealed oxide film by an etching solution becomes ⅓ that of the oxide film which is simply deposited by a CVD method. In other words, the annealed film is not so easily etched. Therefore, after ion-implantation (to be described later with reference to FIG. 1C), when a surface region of a wall 18 damaged to ion-implantation is removed by etching, excessive etching can be more effectively prevented. In addition, when an insulating film 23 to be described later with reference to FIG. 1D is etched, the annealed film 17 can more effectively stand the etching.

Note that a silicon nitride film can be used as the insulating material film 17 in place of a silicon oxide film, or the insulating material film 17 can be a combination of a silicon oxide film and a silicon nitride film formed thereon.

The insulating material film 17 is anisotropically etched along a direction of thickness thereof until the top surface of the gate electrode and the surface of the element formation region are exposed. This anisotropic etching can be performed by a reactive ion etching method which is well known to those skilled in the art. As a result, the insulating material film 17 remains only on respective side walls of the gate structure, which is constituted by of the gate electrode 13 and the gate oxide film 15, and the first wiring layer 14, thus forming walls 18 and 19. A thickness t of the walls 18 and 19 corresponds to a thickness of the insulating material film 17.

It should be noted that for the purpose of the present invention, the wall needs to be formed only on the side walls of the gate structure. For this reason, the wall on the side walls of the first wiring layer 14 is not always needed.

Thereafter, an n-type impurity, e.g., arsenic, is selectively ion-implanted at a high concentration in the element formation region of the substrate 11 using the gate structure and the wall 18 as a mask, and is activated so as to form regions 20a and 20b. As a result, a source region 21 and a drain region 22 are formed. The source region 21 consists of the n-type region 16a located immediately under the wall 18 and the n$^+$-type region 20a separated from an edge of the gate insulation film 15. The drain region 22 consists of the n-type region 16b located immediately under the wall 18 and the n$^+$-type region 20b separated from an edge of the gate insulation film 15 (FIG. 1C). In this case, the regions 16b and 20b preferably have substantially the same depth. The source and drain regions 21 and 22 have lightly doped drain (LDD) structures.

Next, as shown in FIG. 1D, the insulating film 23 is formed on the overall surface of the structure shown in FIG. 1C under conditions wherein the insulating film, which has a higher etching rate at a step portion thereof than at a flat portion thereof (e.g., 5 to 20 times and preferably, 10 times or more), can be formed. The insulating film 23 can be formed of, for example, silicon oxide, silicon nitride or tantalum oxide and can be formed by a plasma CVD method or a sputtering method. (It should be noted that since a film formed by an ordinary reduced-pressure CVD method has substantially the same etching rate at the step and flat portions, the ordinary reduced-pressure CVD method cannot be used.) When a silicon oxide film is formed as the film 23 by a plasma CVD method, a mixture of SiH$_4$ and N$_2$O gases is used as a plasma generation gas at respective flow rates of 10 ml/min. to 30 ml/min. and 200 ml/min. to 400 ml/min., and is added with 200 ml/min. to 400 ml/min. of argon gas. Under these conditions the plasma CVD is conducted at a vacuum pressure of 0.2 Torr to 0.4 Torr, and at a temperature of 250° C. to 300° C.

When the insulating film 23 is formed by sputtering, the pressure in a vacuum chamber is reduced to 10$^{-6}$ Torr, and thereafter, an inert gas such as argon gas is introduced therein to several tens millitorrs. The inert gas is impinged upon the target insulating material such as silicon oxide, silicon nitride and tantalum oxide by application of high frequency power of 1.0 to 1.5 KW at 13.56 MHz. Thus, the insulating film 23 is formed.

A thickness of the insulating film 23 is from 5,000 Å (500 nm) to 10,000 Å (1,000 nm).

After forming the insulating film 23, a resist pattern 24 is selectively formed to cover a portion of the insulating film 23 corresponding to the first wiring layer 14 and the step portion thereof. Since the resist pattern 24 must cover only the step portion of the insulating film 23, a mask aligning margin can be sufficiently large in comparison to the case where a contact hole is formed. Note that if the first wiring layer 14 on the oxide film 12 is formed apart from the drain region 22 by 0.5 μm (i.e., maximum mask aligning error) or more, the resist pattern 24 need not be formed.

An exposed portion of the insulating film 23 is subjected to wet etching. When the insulating film 23 is a silicon oxide film, a buffered hydrofluoric acid solution (a mixture solution of hydrogen fluoride and ammonium fluoride) or a dilute hydrofluoric acid solution can be used as an etching solution. When the insulating film 23 is a silicon nitride film, phosphoric acid solution can be used as an etching solution.

Figure 1E:
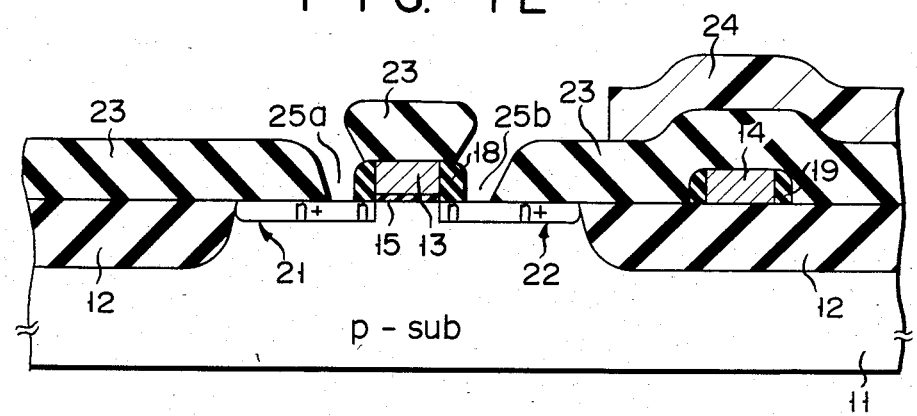

As described above, since the insulating film 23 has a higher etching rate at a step portion than at a flat portion by 5 to 20 times, the step portion of the insulating film 23 is selectively and quickly etched, thereby forming narrow groove-like contact holes 25a and 25b (FIG. 1E). In the case of wet etching, since the wall 18 exposed through the contact holes 25a and 25b is formed of a material having an etching rate sufficiently lower than that of the insulating film 23, the wall 18 is not removed by the etching of the insulating film 23. Also, a portion of the insulating film 23 which is covered by the resist pattern 24 is not etched.

Figure 1F:
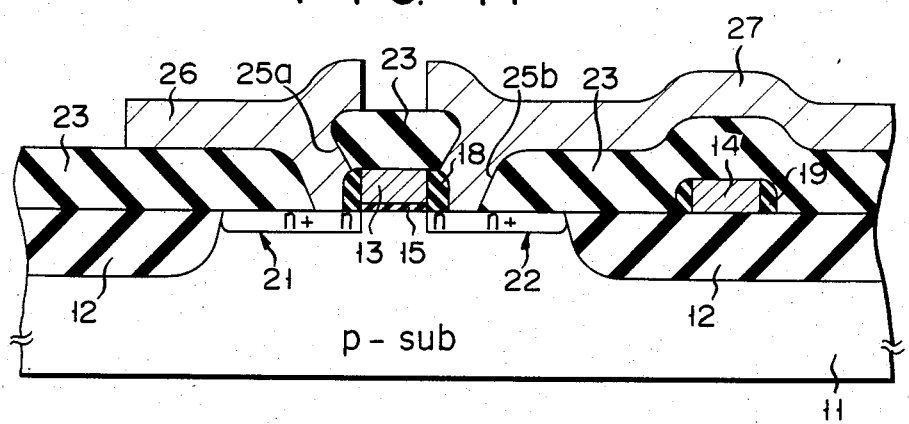

Finally, after removing the resist pattern 24, a wiring material such as aluminum or doped polycrystalline silicon is deposited on the overall surface of the resultant structure and is patterned to form wiring layers 26 and 27, which are respectively connected to the source and drain regions 21 and 22 through the corresponding contact holes 25a and 25b (FIG. 1F). Thus, an n-channel MOS transistor is manufactured.

As described above, according to the present invention, the contact holes can be formed in self-alignment with the gate structure and the source and drain regions without requiring precise mask alignment and heat treatment at high temperature. The gate electrode will not be undesirably exposed through the contact holes because of the presence of the wall formed on the side walls of the gate structure. In this manner, according to the present invention, since the impurity regions (e.g., the impurity layer of the channel region for controlling a threshold value, the source and drain regions and the like) are not unnecessarily extended and the contact holes are formed in self-alignment, high-speed micropatterned MOS transistors can be realized.

It should be noted that the present invention is not limited to the above embodiment. For example, in the above embodiment, the insulating film 23 is formed directly on a top surface of the gate electrode, but it can be formed on the gate electrode through a protective film. Another embodiment will be described with reference to FIGS. 2A and 2B. A thin oxide film and a polycrystalline silicon film are formed in the same manner as described above in FIG. 1A, and thereafter, a protective material film of silicon oxide is formed on the polycrystalline silicon film. The protective material film may be formed by a silicon oxide layer and a silicon nitride layer formed on the silicon oxide layer. The protective material film, the polycrystalline silicon film and the thin oxide film are sequentially removed, thus forming protective films 31a and 31b which comprise the remaining protective material film, the gate electrode 13, the gate oxide film 15 and the first wiring layer 14 (FIG. 2A). Thereafter, the same processes as in FIGS. 1B to 1F are applied to the structure shown in FIG. 2A (provided that the anisotropic etching process described in FIG. 1B is performed until the top surface of the protective film 31 is exposed so as not to expose the gate electrode 13). In this manner, as shown in FIG. 2B, a transistor having a structure in which the protective film 31a is present between the insulating film 23 and the top surface of the gate electrode 13 can be obtained. As is apparent from FIG. 2B, the wall 18 is formed also on side surfaces of the protective film 31a. Even when an etching amount along the lateral direction of the insulating film 23 varies and a portion of the insulating film 23 on the gate structure is excessively etched, the surface of the gate electrode 13 is not exposed due to the formation of the protective film 31a. Therefore, when wiring layers 35a and 35b are formed later, short-circuiting between the source and drain regions can be satisfactorily prevented. Note that the protective films 31a and 31b preferably consists of a silicon oxide film formed directly on the gate electrode and a silicon nitride film formed thereon.

Furthermore, in the former embodiment, the wiring layers 26 and 27 are coupled to the source and drain regions 21 and 22 through the contact holes 25a and 25b, respectively. However, the wiring layers 26 and 27 can be formed after burying the contact holes 25a and 25b with a conductive material. After performing the processes described in FIGS. 1A to 1E, the resist pattern 24 is removed. Thereafter, tungsten is vapor-deposited on the resultant structure, using tungsten hexafluoride in a tungsten hexafluoride reducing atmosphere. In this case, since tungsten is selectively deposited only on the silicon surface, tungsten layers 41a and 41b burying the contact holes 25a and 25b are formed (see FIG. 3). Thereafter, the wiring layers 26 and 27 are formed, thus obtaining a transistor. This selective growth method of tungsten is described in IEDM Technical Digest (1983), pp. 550–553 in more detail. Note that the procedures as just described can also be applied to the embodiment in FIGS. 2A and 2B.

Furthermore, in the above embodiment, the wall 18 is formed by anisotropically etching the insulating material layer 17. However, the wall 18 can be formed by another method. After obtaining the structure shown in FIG. 1B, an impurity such as phosphorus is ion-implanted to a depth corresponding to a thickness of the insulating film 17. This ion-implantation can be performed at 80 KeV and at a dose of $1 \times 10^{15}/cm^2$, for example. In this ion-implantation method, the impurity cannot be implanted in respective portions of the insulating film 17 on the side walls of the gate structure and the first wiring layer 14. After ion-implantation, the insulating film 17 is subjected to isotropic dry etching without annealing. An insulating material such as silicon oxide in which an impurity is implanted has a higher etching rate than that of an insulating material in which no impurity is implanted (e.g., 5 times to 10 times). Therefore, the insulating film 17 portion except for the portion thereof corresponding to the walls 18 and 19 is removed by the isotropic etching, thus obtaining the structure corresponding to that shown in FIG. 1C. For the portion of the insulating film 17 on the oxide film 12, if the impurity is ion-implanted in the insulating film portion on the side walls of the first wiring layer 14 and the insulating film portion is dry etched, the wall 19 is not formed.

Needless to say, according to these modifications, the same effect as described in FIGS. 1A to 1F can be achieved.

What is claimed is:

1. A method of manufacturing a semiconductor device, comprising the steps of:
    forming an element isolation region in a surface of a semiconductor substrate of a first conductivity type to provide an island element region surrounded by said element isolation region;
    forming a gate structure on a surface of said island element region, said gate structure including a gate insulating film and a gate electrode film formed thereon;
    doping an impurity having a second conductivity type opposite to the first conductivity type by using said gate structure as a mask, thereby forming first and second semiconductor regions in the island element region;
    forming a wall of an insulating material on a side wall of said gate structure;
    depositing an insulating film on an entire surface of said semiconductor substrate which includes said element isolation region, said island element region and said gate structure including said wall;
    selectively etching a portion of said insulating film which corresponds to a step portion formed by surfaces of said insulating wall and said island element region to form first and second contact holes so as to partially expose said first and second semiconductor regions therethrough; and
    forming a wiring layer on the remaining insulating film so as to electrically connect to said first and second semiconductor regions through said first and second contact holes.

2. A method according to claim 1, wherein said wall is formed by forming an insulating material layer on the entire surface of said semiconductor substrate, which includes said gate structure, said island element region and said element isolation region, and anisotropically etching said insulating material layer until an upper surface of said gate structure is exposed.

3. A method according to claim 1, wherein said wall is formed by forming an insulating material layer on the entire surface of said semiconductor substrate, which includes said gate structure, said island element region and said element isolation region, ion-implanting an impurity in a portion of said insulating material layer excluding a portion thereof which is formed on the side wall of said gate structure, and isotropically etching said insulating material layer to remove only the portion thereof doped with said impurity.

4. A method according to claim 1, wherein said insulating film is formed under a condition wherein the insulating film, which has a higher etching rate at a step portion thereof than at a flat portion thereof, is formed.

5. A method according to claim 4, wherein said insulating film comprises silicon oxide or silicon nitride.

6. A method according to claim 4, wherein said insulating film is formed by plasma chemical vapor deposition.

7. A method according to claim 4, wherein said insulating film is selectively etched by wet etching.

8. A method according to claim 4, wherein said insulating film is formed by sputtering.

9. The method of claim 1, further comprising forming a source region and a drain region by impurity doping in the first semiconductor region and forming a source region and drain region by impurity doping in the second semiconductor region prior to depositing an insulating film on the surface of the semiconductor substrate.

10. The method of claim 1, further comprising doping the gate structure with an impurity of the second conductivity type.

11. A method according to claim 1, further comprising the step of forming an insulating protective film between the upper surface of said gate structure and said insulating film.

12. A method according to claim 11, wherein said protective film comprises silicon oxide.

13. A method according to claim 11, wherein said protective film comprises a silicon oxide film directly formed on the upper surface of said gate structure and a silicon nitride film formed on said silicon oxide film.

14. A method according to claim 1, further comprising the step of forming a conductive material layer in said first and second contact holes.

15. A method according to claim 14, wherein said conductive material film is deposited by selective growth based on a reduction reaction of tungsten hexafluoride.

* * * * *